(12) United States Patent
Vankayala

(10) Patent No.: US 11,164,613 B2
(45) Date of Patent: Nov. 2, 2021

(54) PROCESSING MULTI-CYCLE COMMANDS IN MEMORY DEVICES, AND RELATED METHODS, DEVICES, AND SYSTEMS

(71) Applicant: Micron Technology, Inc., Boise, ID (US)

(72) Inventor: Vijayakrishna J. Vankayala, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/700,212

(22) Filed: Dec. 2, 2019

(65) Prior Publication Data

US 2021/0166742 A1 Jun. 3, 2021

(51) Int. Cl.
| | | |
|---|---|---|
| *G11C 11/408* | (2006.01) | |
| *G11C 7/22* | (2006.01) | |
| *G11C 7/10* | (2006.01) | |
| *G11C 7/06* | (2006.01) | |

(52) U.S. Cl.
CPC .............. *G11C 7/222* (2013.01); *G11C 7/065* (2013.01); *G11C 7/1063* (2013.01); *G11C 7/1072* (2013.01); *G11C 11/408* (2013.01)

(58) Field of Classification Search
CPC ........................................................ G11C 5/04
USPC ................................................... 365/230.03
See application file for complete search history.

(56) References Cited

U.S. PATENT DOCUMENTS

| | | | |
|---|---|---|---|
| 5,835,965 A * | 11/1998 | Taylor ................. | G06F 12/0292 711/211 |
| 8,687,449 B2 * | 4/2014 | Yoko ....................... | G11C 8/12 365/219 |
| 9,324,441 B1 | 4/2016 | Shah | |
| 9,767,886 B2 | 9/2017 | Choi et al. | |
| 10,373,654 B1 | 8/2019 | Vankayala et al. | |
| 10,395,702 B1 | 8/2019 | Brown et al. | |
| 2006/0146641 A1 | 7/2006 | Demone | |
| 2016/0314085 A1 * | 10/2016 | Ware ................... | G06F 13/1673 |

(Continued)

FOREIGN PATENT DOCUMENTS

WO    2010/062302 A1    6/2010

OTHER PUBLICATIONS

International Search Report for Application No. PCT/US2020/055198, dated Jan. 29, 2021, 4 pages.

(Continued)

*Primary Examiner* — Min Huang
(74) *Attorney, Agent, or Firm* — TraskBritt

(57) ABSTRACT

Methods of operating a memory device are disclosed. A method may include receiving, at a first die of a number of dies, a first number of bits including one or more command bits, one or more identification bits, and a first number of address bits associated with a command during a first clock cycle. The method may further include conveying, from the first die to at least one other die, at least some of the first number of bits. Further, the method may include receiving, at the first die, a second number of bits including a second number of address bits associated with the command during a second, subsequent clock cycle. Also, the method may include conveying, from the first die to the at least one other die, at least some of the second number of bits. Memory devices and electronic systems are also disclosed.

20 Claims, 10 Drawing Sheets

(56) References Cited

U.S. PATENT DOCUMENTS

| | | | |
|---|---|---|---|
| 2017/0256311 A1 | 9/2017 | Chang et al. | |
| 2019/0066745 A1 | 2/2019 | Wilmoth et al. | |
| 2019/0303042 A1* | 10/2019 | Kim | H01L 23/481 |
| 2020/0004436 A1* | 1/2020 | Jiang | G11C 11/401 |

OTHER PUBLICATIONS

Written Opinion of the International Searching Authority for Application No. PCT/US2020/055198, dated Jan. 29, 2021, 4 pages.

\* cited by examiner

PROCESSING MULTI-CYCLE COMMANDS IN MEMORY DEVICES, AND RELATED METHODS, DEVICES, AND SYSTEMS

TECHNICAL FIELD

Embodiments of the disclosure relate to processing multi-cycle commands in memory devices. More specifically, various embodiments relate to processing multi-cycle commands in memory devices including a die stack configuration, and to related methods, devices, and systems.

BACKGROUND

Memory devices are typically provided as internal, semiconductor, integrated circuits in computers or other electronic systems. There are many different types of memory including, for example, random-access memory (RAM), read only memory (ROM), dynamic random access memory (DRAM), synchronous dynamic random access memory (SDRAM), resistive random access memory (RRAM), double data rate memory (DDR), low power double data rate memory (LPDDR), phase change memory (PCM), and Flash memory.

Memory systems can employ memory devices to store and access information. The memory devices can include volatile memory devices, non-volatile memory devices, or a combination device. Memory devices, such as DRAM, may utilize electrical energy to store and access data. Some memory devices may include a multi-die package including stacked dies (e.g., die stacks) that are connected using Through-Silicon-Vias (TSVs) and/or wire bonds in a master-slave (MS) configuration. For example, the memory devices can include Double Data Rate (DDR) RAM devices that implement DDR interfacing scheme for high-speed data transfer. Multiple DDR RAM devices (e.g., DDR4 devices, DDR5 devices, etc.) may be included and configured as master die and one or more slave dies.

RAM devices, such as those employed in electrical devices to provide data processing and/or storage, may provide direct availability to addressable data stored in memory circuitry of a device. Certain RAM devices, such as dynamic RAM (DRAM) devices may, for example, include multiple memory banks having many addressable memory elements. RAM devices may also have a command interface that may receive addresses and instructions (e.g., read, write, etc.) for operations that may be associated with those addresses and decoding circuitry that may process the instructions and the addresses to access the corresponding memory banks. The instructions and addresses to a RAM device may be provided by processing circuitry of an electrical device external to the RAM device. The electrical device may also provide clocking signals that may be synchronous with the instructions and addresses.

DETAILED DESCRIPTION

Figure 1A:
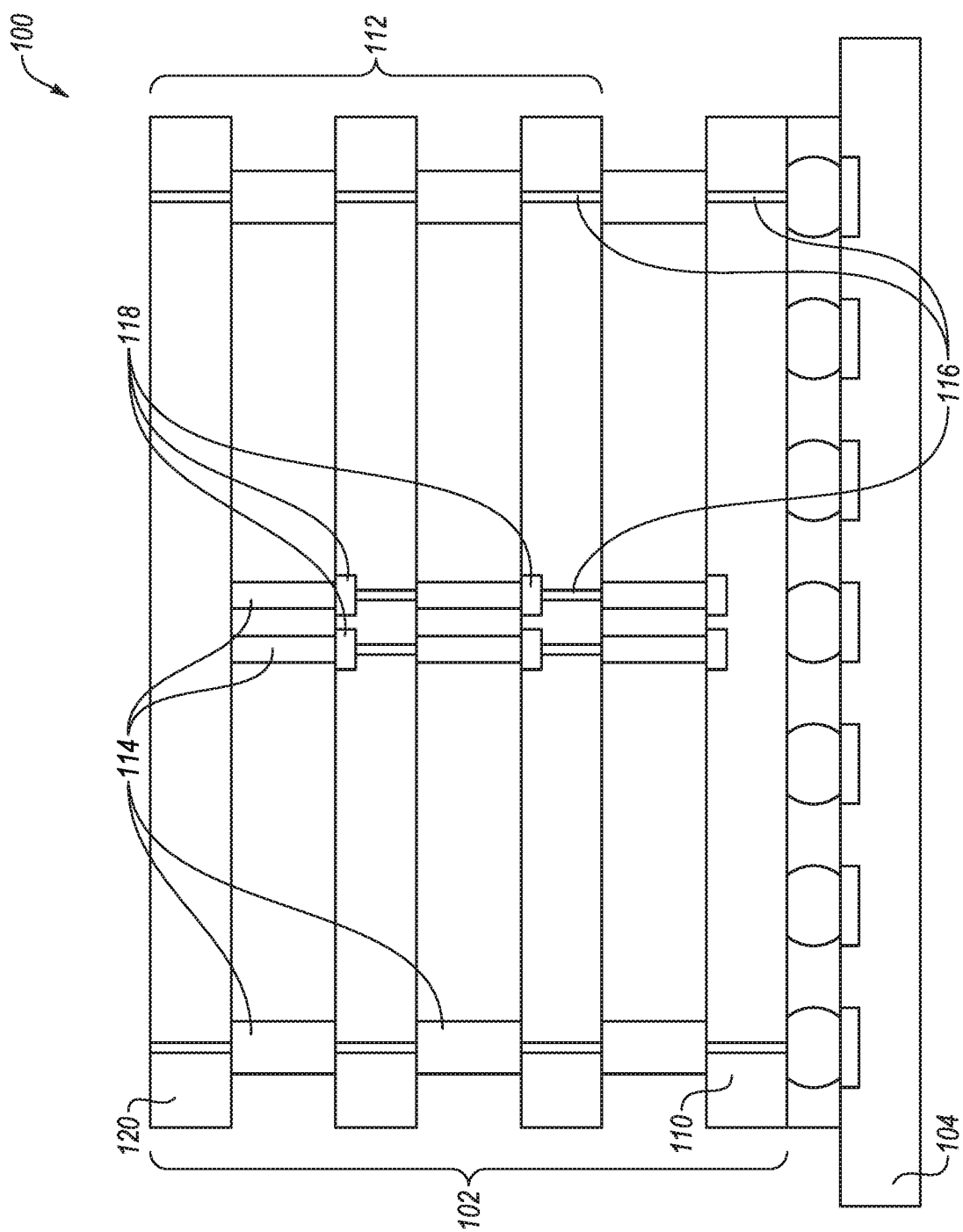
FIG. 1A depicts an example memory device including a number of dies, according to various embodiments of the present disclosure.

As will be appreciated, in DDR4 and prior devices including either a single-die package or a multi-die package configured for use with single-cycle commands, all command bits, chip identification (Cid or ChipID) bits, and address bits associated with a command are received at a die during a single clock cycle. In a multi-die package configuration, command and Cid bits are decoded at a master die, and the address is latched on the master die and conveyed to a slave die. In other devices that use multi-cycle commands, such as DDR5 devices, command bits, Cid bits, and address bits are provided to a die over more than one clock cycle (e.g., two clocks, or three clocks in a 2N mode).

Various embodiments described herein relate to methods for processing multi-cycle commands. More specifically, according to at least some embodiments including a die stack (i.e., including a master die and at least one slave die), a first signal associated with a command may be received and decoded during a first clock cycle, and a second signal associated with the command may be received and decoded during a second, subsequent clock cycle. Yet more specifically, according to some embodiments, in a two-cycle command process, a first signal including command bits, chip identification (Cid) bits, and possibly one or more address bits may be received and decoded at a master die during a first clock cycle (e.g., in response to an edge (e.g., a rising or falling edge) of the first clock cycle). Further, a signal including at least some of the command bits, chip identification (Cid) bits, and possibly one or more address bits may then be conveyed to one or more slave dies. Further, a signal including one or more additional address bits may be received and decoded at the master die during a second clock cycle (e.g., in response to an edge (e.g., a rising or falling edge) of the second clock cycle). Also, a signal including at least some of the one or more additional address bits may then be conveyed to the one or more slave dies. In these embodiments, Cid bits may be compared with its local Cid bits (stacked bits, fuses on each die and depend on the stack height) and upon a match be used to enable command and address bits on the slave die.

Various embodiments as disclosed herein may reduce a number of signals transmitted from a master die to one or more slave dies and/or may improve speed and/or performance of memory devices including a master die and one or more slave dies. For at least these reasons, various embodiments of the present disclosure, as described more fully herein, provide a technical solution to one or more problems that arise from technology that could not reasonably be performed by a person, and various embodiments disclosed herein are rooted in computer technology in order to overcome various problems and/or challenges associated with memory devices utilizing multi-cycle commands. Further, at least some embodiments disclosed herein may improve computer-related technology by allowing computer performance of a function not previously performable by a computer.

Many electrical devices may include RAM devices that are coupled to processing circuitry, and may provide storage of data for processing. Examples of RAM devices include dynamic RAM (DRAM) devices and synchronous DRAM (SDRAM) devices, which may store individual bits electronically. The stored bits may be organized into addressable memory elements (e.g., words), which may be directly accessed by the processing circuitry. Memory devices may also include command circuitry to receive instructions and/or addresses from the processing circuitry. For example, in double data rate type five (DDR5) devices, instructions and addresses may be provided by using a 14 bit command/address (CA) signal.

Processing circuitry may also provide clocking signals to the memory device along with instructions and/or addresses. In DDR5 SDRAM devices, such a clocking signal Clk may be provided by a differential signal pair Clk_t and Clk_c. The clocking signal may provide information to the memory device about when an instruction and/or an address signal is ready to be processed. For example, processing circuitry may provide a clocking signal and instructions to a DDR5 device such that the CA signal may be available (e.g., stable, ready) for processing during a transition (e.g., edge) of the Clk signal. A DDR5 device, as well as other memory devices configured to share instruction buses, may also receive a chip select (CS) signal, which may inform the memory device that it is the intended destination of the CA signal available on the instruction bus. Moreover, in some standards, such as in the DDR5 standard, commands may be provided using a two-cycle (e.g., two-step) CA signal. In such cases, the CS signal may be used to indicate to the memory device whether the current CA signal is a first or second part of a two-cycle CA signal.

Embodiments of the present disclosure will now be explained with reference to the accompanying drawings.

FIG. 1A is a block diagram of a memory device 100 (e.g., a semiconductor die assembly, including a three-dimensional integration (3DI) device or a die-stacked package) in accordance with various embodiments of the present disclosure. For example, memory device 100 may include a DRAM (e.g., DDR5 DRAM) device, or a portion thereof.

Memory device 100, which may also be referred to herein as a "multi-die package," includes one or more semiconductor dies (e.g., a die stack 102 including multiple dies) mounted on or connected to a substrate 104 (e.g., another die or a PCB). For example, memory device 100 includes die stack 102 having a master die 110 along with one or more slave dies 112. Master die 110 may be configured to interact/interface with a component/device (e.g., a controller, a central processing unit (CPU), and/or a host device) of a system (e.g., a computing system or a memory system). Master die 110 may provide interactions or interface functions between slave dies 112 and/or other components of the system. For example, master die 110 may receive commands and data from the system, and communicate the received commands and data to the appropriate die (e.g., itself or one of the slave dies 112). Master die 110 may be configured to communicate based on chip identification (Cid) bits that accompany the command.

Die stack 102 may include interconnects 114 between dies for facilitating die-to-die communications. Interconnects 114 may be electrically conductive structures (e.g., interconnect pillars, solder bumps, etc.) resulting from a bonding or other joining process. Interconnects 114 may be connected to active circuits on the connected dies and/or through-silicon vias (TSVs) 116. TSVs 116 may facilitate communications through corresponding dies or portions thereof. The dies can include bond pads 118, such as conductive portions/locations on the dies, configured to provide electrical connections between the active circuits on the die and the external signaling structures (e.g., interconnects 114, TSVs 116, etc.).

Based on interconnects 114, TSVs 116, and/or bond pads 118, master die 110 may communicate signals to/from a target die 120 (e.g., one of the slave dies 112) according to the chip identification. For example, master die 110 may communicate signals corresponding to a read function or a write function associated with target die 120.

Although memory device 100 is depicting as being configured for communication via TSVs 116, the present disclosure is not so limited, and other multi-die package configurations (e.g., a multi-die package configured for communication via wire bonds) are within the scope of the disclosure.

Figure 1B:
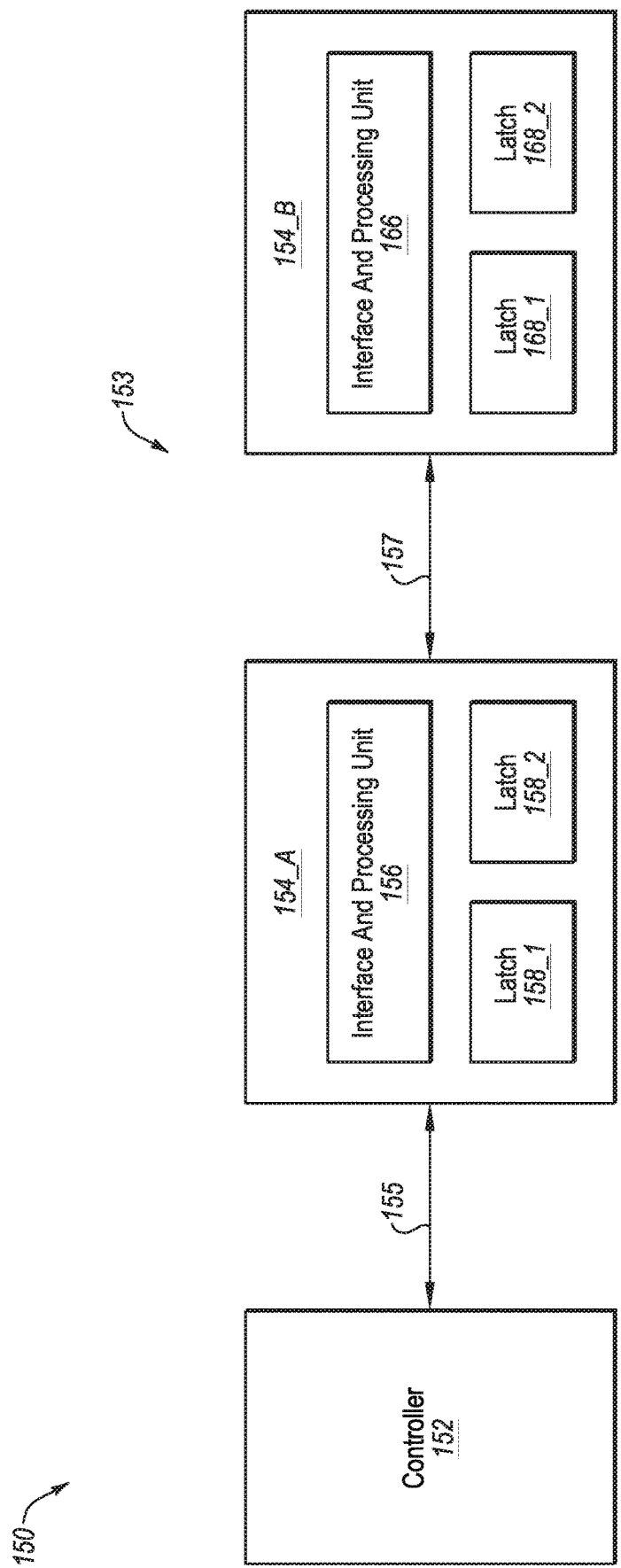
FIG. 1B is a block diagram depicting a memory system including a controller and a memory device including a number of dies, in accordance with various embodiments of the present disclosure.

FIG. 1B is a block diagram depicting a memory system 150 including a controller 152 and a memory device 153 including a number of memory dies 154, in accordance with various embodiments of the present disclosure. In at least some embodiments, a memory die 154_A, which may include a memory device (e.g., memory device 200 of FIG. 2) includes a master die (e.g., master die 110 of FIG. 1A). Further, a memory die 154_B, which may also include a memory device (e.g., a memory device 200 of FIG. 2) includes a slave die (e.g., slave die 112 of FIG. 1A). Controller 152, which may include a processor or any other type of controller, may be configured to communicate with memory die 154_A via a communication bus 155.

As illustrated, each of memory die 154_A and memory die 145_B includes an interface and processing unit, and a number of latches. For example, each of interface and processing unit 156 of memory die 154_A and interface and processing unit 166 of memory die 154_B may include a command interface (e.g., command interface 204 of FIG. 2), a command decoder (e.g., command decoder 218 of FIG. 2), an I/O interface (e.g., I/O interface 206 of FIG. 2), and/or any other components for receiving, processing, and/or transmitting data and/or controlling operation of an associated die.

More specifically, and as described more fully below, memory die 154_A, and more specifically, interface and processing unit 156 of memory die 154_A may be configured to receive and process (e.g., decode) signals received from controller 152. Further, memory die 154_A may be configured to latch various bits (e.g., Cid bits and address bits) in one more latches, such as latch 158_1 and latch 158_2. Further, interface and processing unit 166 of memory die 154_B may be configured to receive and process signals received from memory die 154_A via a communication bus 157. Further, memory die 154_B may be configured to latch various bits (e.g., Cid bits and address bits) in one more latches, such as latch 168_1 and latch 168_2.

Figure 2:
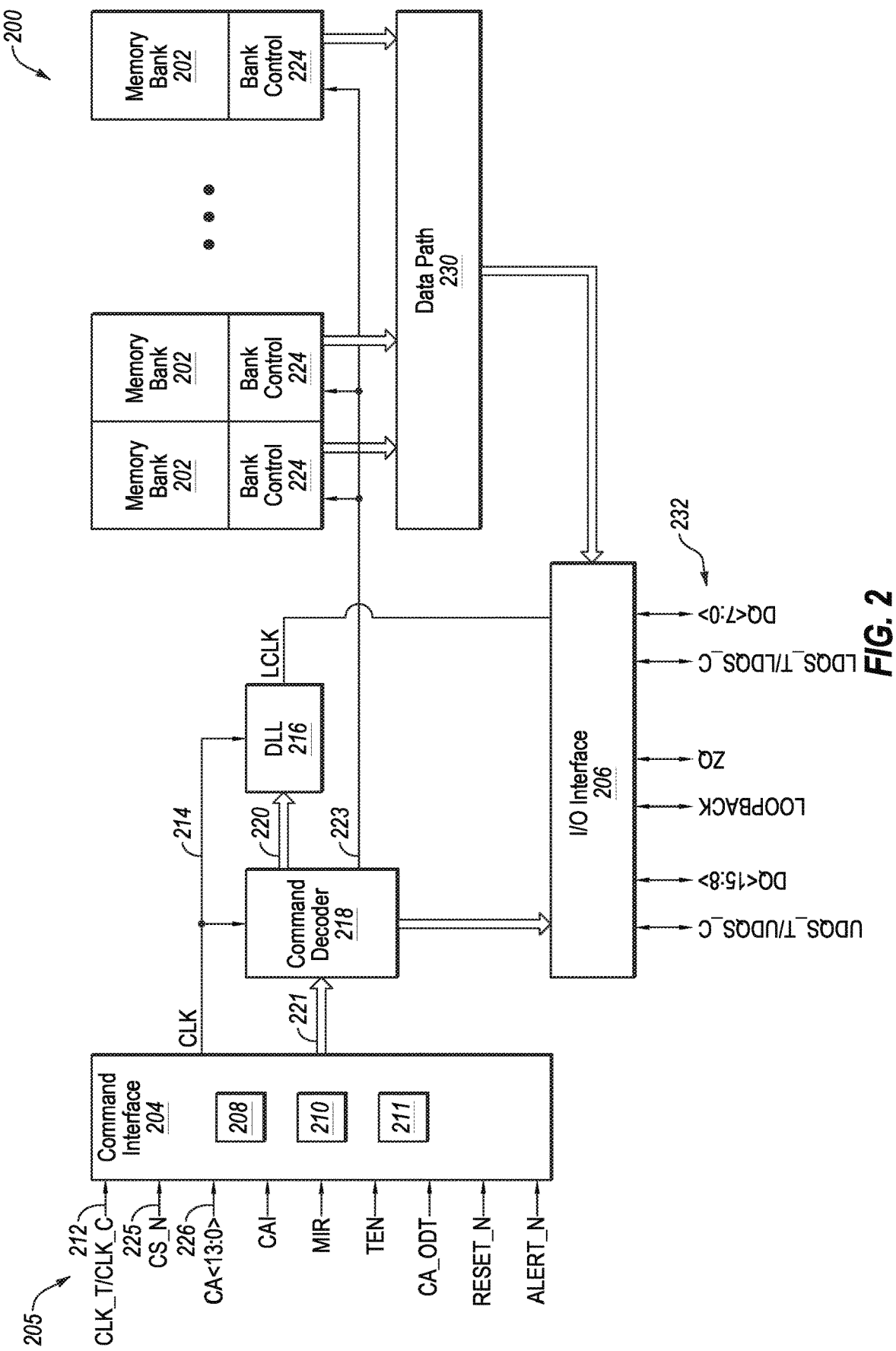
FIG. 2 illustrates an example memory device, according to various embodiments of the present disclosure.

FIG. 2 is a simplified block diagram illustrating certain features of a memory device 200. Specifically, FIG. 2 is a functional block diagram illustrating certain functionality of memory device 200. For example, master die 110 and each slave die 112 of memory device 100 (see FIG. 1A) may include a memory device, such as memory device 200. In accordance with some embodiments, memory device 200 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

Memory device 200 may include a number of memory banks 202. Memory banks 202 may include DDR5 SDRAM memory banks, for instance. Memory banks 202 may be provided on one or more chips (e.g., SDRAM chips) that are arranged, for example, on dual inline memory modules (DIMMS). Each DIMM may include a number of SDRAM memory chips (e.g., x8 or x16 memory chips), as will be appreciated. Each SDRAM memory chip may include one or more memory banks 202. Memory device 200 represents a portion of a single memory chip (e.g., SDRAM chip) having a number of memory banks 202. For DDR5, memory banks 202 may be further arranged to form bank groups. For instance, for an 8 gigabyte (GB) DDR5 SDRAM, a memory chip may include 16 memory banks 202, arranged into 8 bank groups, each bank group including 2 memory banks. For a 16 GB DDR5 SDRAM, a memory chip may include 32 memory banks 202, arranged into 8 bank groups, each bank group including 4 memory banks, for instance. Various other configurations, organization and sizes of memory banks 202 of memory device 200 may be utilized depending on the application and design of the overall system.

Memory device 200 may include a command interface 204 and an input/output (I/O) interface 206. Command interface 204 is configured to receive a number of signals (e.g., signals 205) from processing circuitry coupled to memory device 200, such as a processor or controller (e.g., controller 152 of FIG. 1B). The processor or controller may provide various signals 205 to memory device 200 to facilitate the transmission and reception of data to be written to or read from memory device 200.

As will be appreciated, command interface 204 may include a number of circuits, such as a clock input circuit 208, a command address input circuit 210, and a chip select input circuit 211, for instance, to ensure proper handling of signals 205. Input circuits 208, 210, and 211 may, for example, perform synchronous latching to provide stable signals for further processing by memory device 200. Command interface 204 may receive one or more clock signals from an external device. Generally, double data rate (DDR) memory utilizes a clock signal referred to herein as Clk signal 212, which may be provided as a differential pair formed by a true clock signal (Clk_t) and a complementary clock signal (Clk_c). A positive clock edge for Clk signal 212 in DDR refers to the point where the rising true clock signal Clk_t crosses the falling complementary clock signal Clk_c, while a negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

Clock input circuit 208 may receive true clock signal Clk_t and complementary clock signal Clk_) and generate an internal clock signal CLK 214. Internal clock signal CLK 214 may be supplied to an internal clock generator, such as a delay locked loop (DLL) circuit 216. DLL circuit 216 may generate a phase controlled internal clock signal LCLK based on received internal clock signal CLK 214 and the command signals from a command decoder 218 received by DLL circuit 216 over bus 220. Phase controlled internal clock signal LCLK may be supplied to I/O interface 206, for instance, and may be used as a timing signal for determining an output timing of read data. Internal clock signal CLK 214 may also be provided to various other components within memory device 200 and may be used to generate various additional internal clock signals. For instance, internal clock signal CLK 214 may be provided to command decoder 218. Command decoder 218 may receive command signals from command bus 221 and may decode the command signals to provide various internal commands. The received command signals may be provided to command bus 221 from latched inputs of input circuits 208, 210, and/or 211.

Further, command decoder 218 may decode commands, such as read commands, write commands, mode-register set commands, activate commands, and provide access to a particular memory bank 202 corresponding to the command, via bus path 223. As will be appreciated, memory device 200 may include various other decoders, such as row decoders and column decoders, to facilitate access to memory banks 202. In at least one embodiment, each memory bank 202 includes a bank control block 224, which may provide necessary decoding (e.g., row decoder and column decoder), as well as other features, such as timing control and data control, to facilitate the execution of commands to and from memory banks 202.

Memory device 200 may executes operations, such as read commands and write commands, based on the command/address signals received from an external device, such as a processor. In some embodiments, command/address (CA) bus may be a 14-bit bus to accommodate the command/address signals 226 (CA<13:0>). The command/address signals may be clocked to command interface 204 using the clock 212 (Clk_t and Clk_c), as discussed above. Command interface 204 may include a command address input circuit 210, which is configured to receive and transmit the commands to provide access to memory banks 202, through command decoder 218, for instance. In addition, command interface 204 may receive a chip select (CS) signal 225. CS signal 225 enables memory device 200 to process commands on the incoming CA<13:0> bus. Access to specific memory banks 202 within memory device 200 may be encoded on CA<13:0> bus with the commands. As an example, a processor requesting data from memory device 200 may provide CS signal 225 via an input pin to inform memory device 200 that it should operate on CA signal 226 available in the bus. In this example, command interface 204 may gate CA signal 226 based on received chip select signal 225 and provide the gated CA signal to memory banks 202 via bus path 223. Based on CA signal 226, memory banks 202 may provide the requested data via data path 230 and I/O interface 206.

In addition, command interface 204 may be configured to receive a number of other command signals. For instance, a command/address on die termination (CA_ODT) signal may be provided to facilitate proper impedance matching within memory device 200. A reset command (RESET) may be used to reset command interface 204, status registers, state machines and the like, during power-up for instance. Command interface 204 may also receive a command/address invert (CAI) signal which may be provided to invert the state of command/address signals CA<13:0> on the command/ address bus, for instance, depending on the command/ address routing for memory device 200.

Data may be sent to and from memory device 200, utilizing the command and clocking signals discussed above, by transmitting and receiving data signals 232 through I/O interface 206. More specifically, data may be sent to or retrieved from memory banks 202 over data path 230, which includes a plurality of bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for a ×16 memory device, the I/O signals may be divided into upper and lower I/O signals (e.g., DQ<15:8> and DQ<7:0>) corresponding to upper and lower bytes of the data signals, for instance.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 200), etc., may also be incorporated into the memory device 200. Accordingly, it should be understood that the block diagram of FIG. 2 is only provided to highlight certain functional features of the memory device 200 to aid in the subsequent detailed description.

Figure 3:
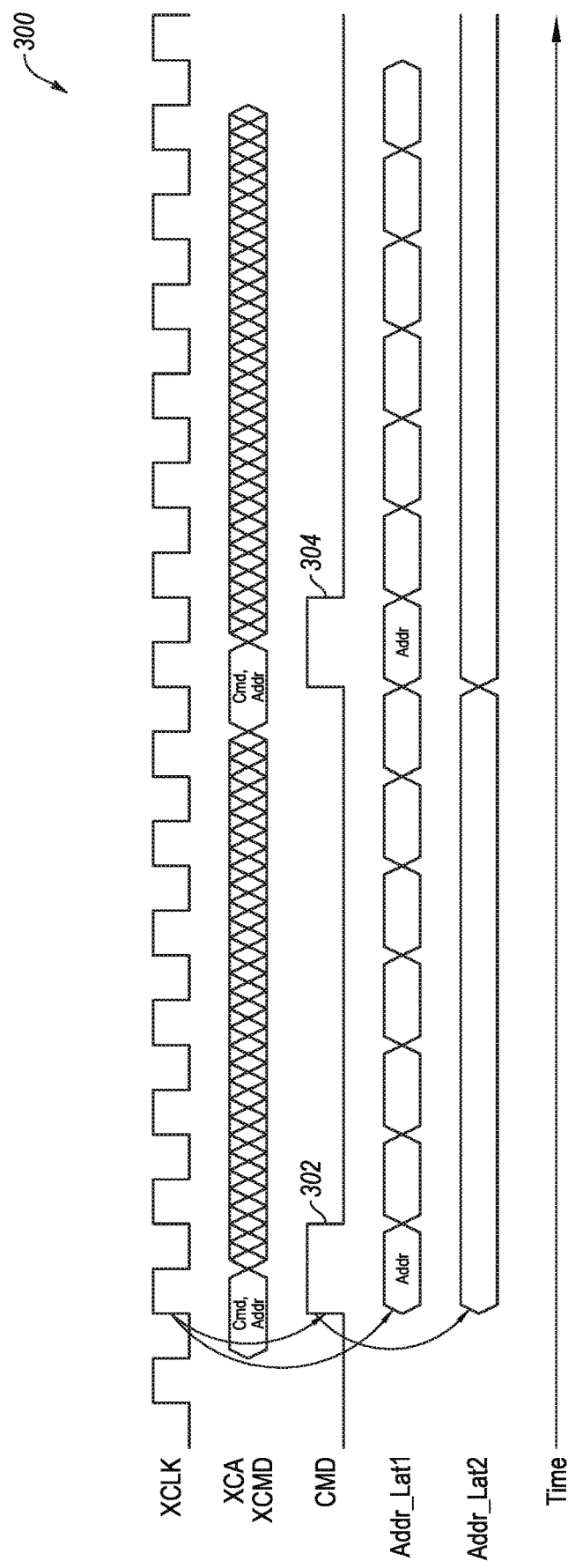
FIG. 3 depicts a timing diagram including various signals associated with a single-die package configured for use with single-cycle commands.

As noted above, DDR4 and other prior devices use single-cycle commands, wherein command bits, chip identification (Cid or ChipID) bits, and address bits are received at a die during a single clock cycle. FIG. 3 depicts a timing diagram 300 including various signals associated with a single-die package (e.g., a DDR4 single-die package (SDP)) configured for use with single-cycle commands. As illustrated, timing diagram 300 includes an external clock signal XCLK, external command and address bit line XCA/XCMD (i.e., for receiving command and address bits), command line CMD including command signals 302 and 304 (e.g., read, write, refresh, or another command), an address latch Addr_Lat1, and an address latch Addr_Lat2.

As shown in timing diagram 300, on a rising edge of external clock signal XCLK, a command signal 302 is received and decoded at a die, and an associated address is latched on address latch Addr_Lat1 of the die. As illustrated, the address is latched on each rising clock edge of external clock signal XCLK. The address is also latched on address latch Addr_Lat2 of the die, and the address latched on address latch Addr_Lat2 may stay valid until receipt of the next received command CMD (i.e., a command signal 304).

On a subsequent rising edge of external clock signal XCLK, command signal 304 is received and decoded, and the associated address is latched on address latch Addr_Lat1 (i.e., on each rising clock edge of external clock signal XCLK). The address is also latched on address latch Addr_Lat2, and the address latched on address latch Addr_Lat2 may stay valid until receipt of the next received command CMD.

Figure 4:
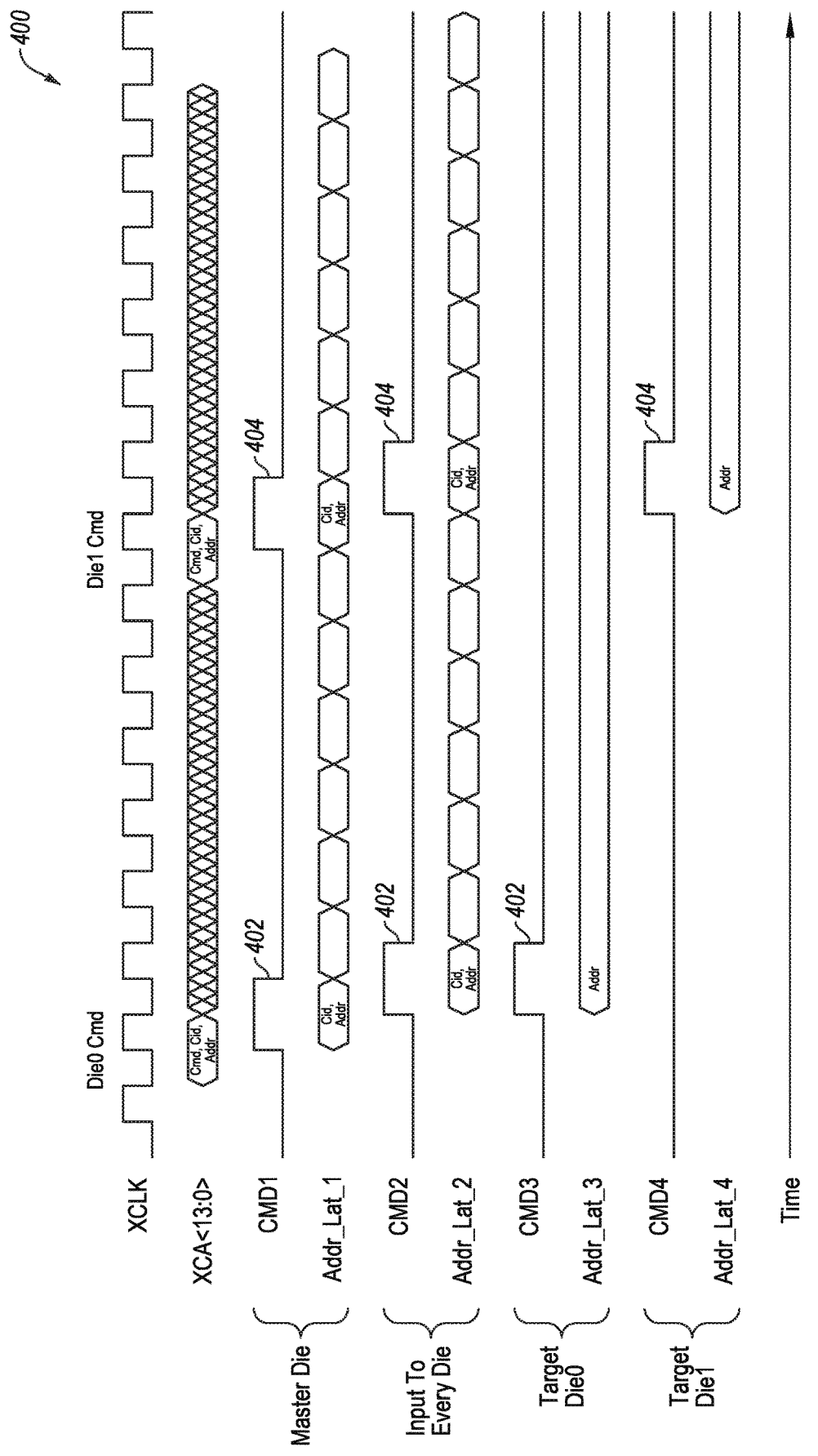
FIG. 4 depicts a timing diagram including various signals associated with a multi-die package configured for use with single-cycle commands.

FIG. 4 includes a timing diagram 400 including various signals associated with multi-die package (e.g., a DDR4 multi-dimensional stacking (3DS) device) including a master die and at least one slave die configured for use with single-cycle commands. As illustrated in FIG. 4, timing diagram 400 includes external clock signal XCLK, and an external command, address, and chip identification (Cid) bit line XCA (i.e., for receiving command, address, and Cid bits). Further, timing diagram 400 depicts a command line CMD1 and an address latch Addr_Lat_1 associated with the master die.

Command line CMD1 includes a command signal 402, which is received and decoded on the master die and conveyed to each die in a stack (e.g., via TSVs and/or wire bonding). In this example, command signal 402 on command line CMD1 includes all command bits, Cid bits, and address bits associated with a command. Further, at the master die, the address is latched on address latch Addr_Lat_1 (i.e., on each rising clock edge of external clock signal XCLK).

Moreover, command signal 402 is conveyed by the master die and received at each die (i.e., the master and each slave die) via a command line CMD2. In other words, each die receives command signal 402 (i.e., from the master die) on a dedicated command line. As expected, command signal 402 on command line CMD2 is delayed relative to command signal 402 on command line CMD1. Further, each die latches the associated address on a dedicated address latch Addr_Lat_2. Moreover, each die compares the received Cid bits (i.e., of command signal 402) to its local Cid bits to determine whether the die is an intended recipient of command signal 402. In this example, the received Cid bits match local Cid bits of a target die Die0, and thus target die Die0 issues command signal 402, and latches the associated address via address latch Addr_Lat_3.

Subsequently, a command signal 404 is received at the master die via command line CMD1. In this example, command signal 404 includes all command bits, Cid bits, and address bits associated with a command. Further, at the master die, the address is latched on address latch Addr_Lat_1 (i.e., on each rising clock edge of external clock signal XCLK). Moreover, command signal 404 is conveyed by the master die, and command signal 404 is received at each die (e.g., the master and each slave die) via command line CMD2. As expected, command signal 404 on command line CMD2 is delayed relative to command signal 404 on command line CMD1. Further, each die latches the associated address on address latch Addr_Lat_2. Moreover, each die compares the received Cid bits (i.e., of command signal 404) to its local Cid bits to determine whether the die is an intended recipient of command signal 404. In this example, the received Cid bits match local Cid bits of a target die Die1, and thus target die Die1 issues command signal 404, and latches the associated address via address latch Addr_Lat_3.

Figure 5:
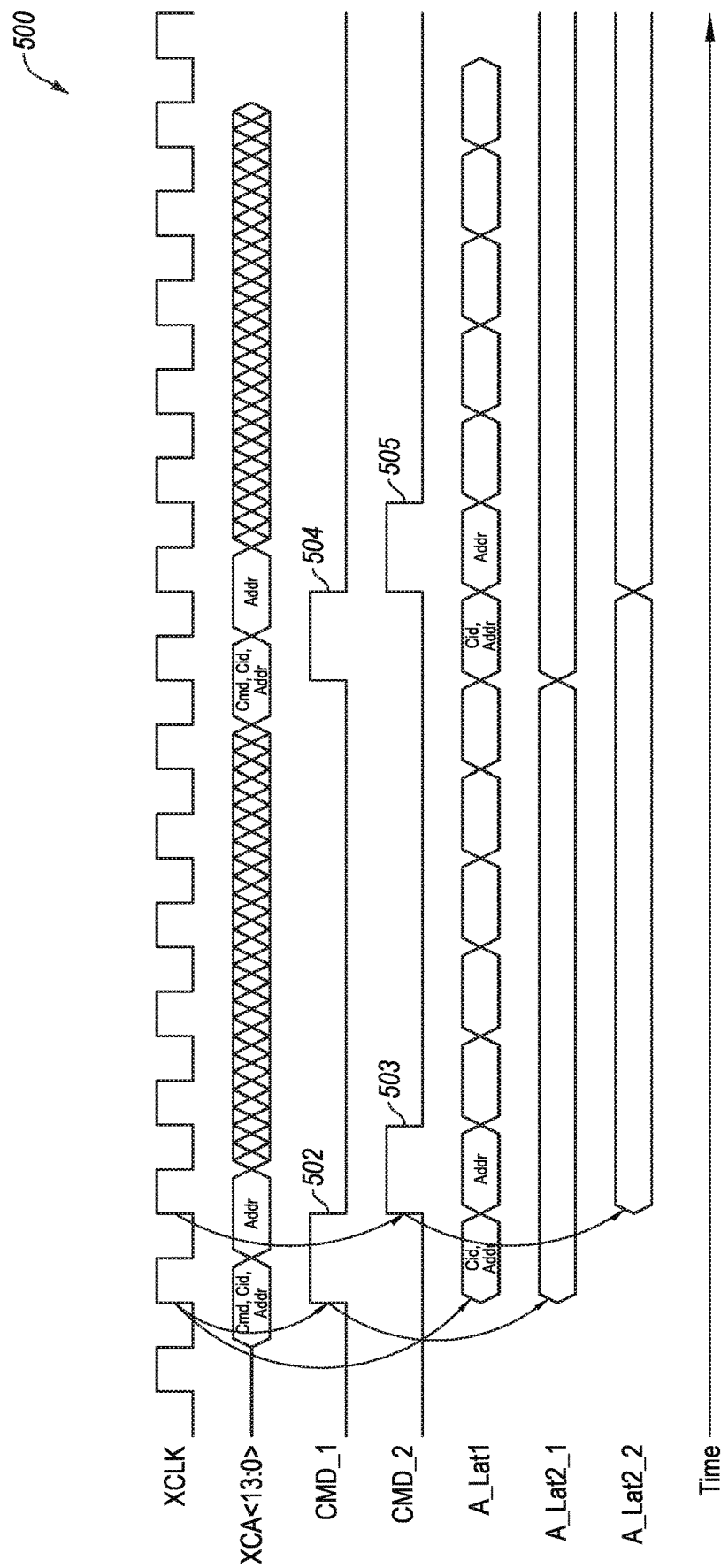
FIG. 5 depicts a timing diagram including various signals associated with a single-die package configured for use with multi-cycle commands.

As noted above, in contrast to devices that use single-cycle commands, some devices (e.g., DDR5 devices) use multi-cycle commands, wherein a first signal may be received during a first clock cycle, and a second signal may be received during a second, subsequent clock cycle. FIG. 5 includes a timing diagram 500 including various signals associated with a single-die package (SDP) device configured for use with multi-cycle commands (e.g., DDR5). As illustrated in FIG. 5, timing diagram 500 includes external clock signal XCLK, an external command, Cid, and address bit line XCA (i.e., for receiving command, Cid, and address bits), a command line CMD_1 including command signals 502 and 504, a command line CMD_2 including command signals 503 and 505, an address latch A_Lat1, an address latch A_Lat2_1, and an address latch A_Lat2_2.

As shown in timing diagram 500, on a rising edge of external clock signal XCLK, command signal 502 is received and decoded at a die. In this example, command signal 502 includes command bits, Cid bits, and possibly some address bits associated with a command. The received Cid bits and address bits are latched on address latch A_Lat1 of the die. The received Cid and address bits are also latched on address latch A_Lat2_1, and the address bits latched on address latch A_Lat2_1 may stay valid until receipt of the next received command CMD (i.e., command signal 504) on command line CMD_1.

Further, on a subsequent rising edge of external clock signal XCLK, command signal 503 is received and decoded at the die. For example, command signal 503 may include additional address bits associated with the command. As illustrated, the additional address bits are latched on address latch A_Lat1 at the die. Further, the additional address bits are latched on address latch A_Lat2_2, and the address bits latched on address latch A_Lat2_2 may stay valid until receipt of the next received command CMD (i.e., command signal 505) on command line CMD_2.

As will be appreciated, this multi-cycle command process may be repeated for signals 504 and 505. More specifically, signal 504 may be received and decoded during a clock cycle, and signal 505 may be received and decoded during a subsequent clock cycle.

Figure 6:
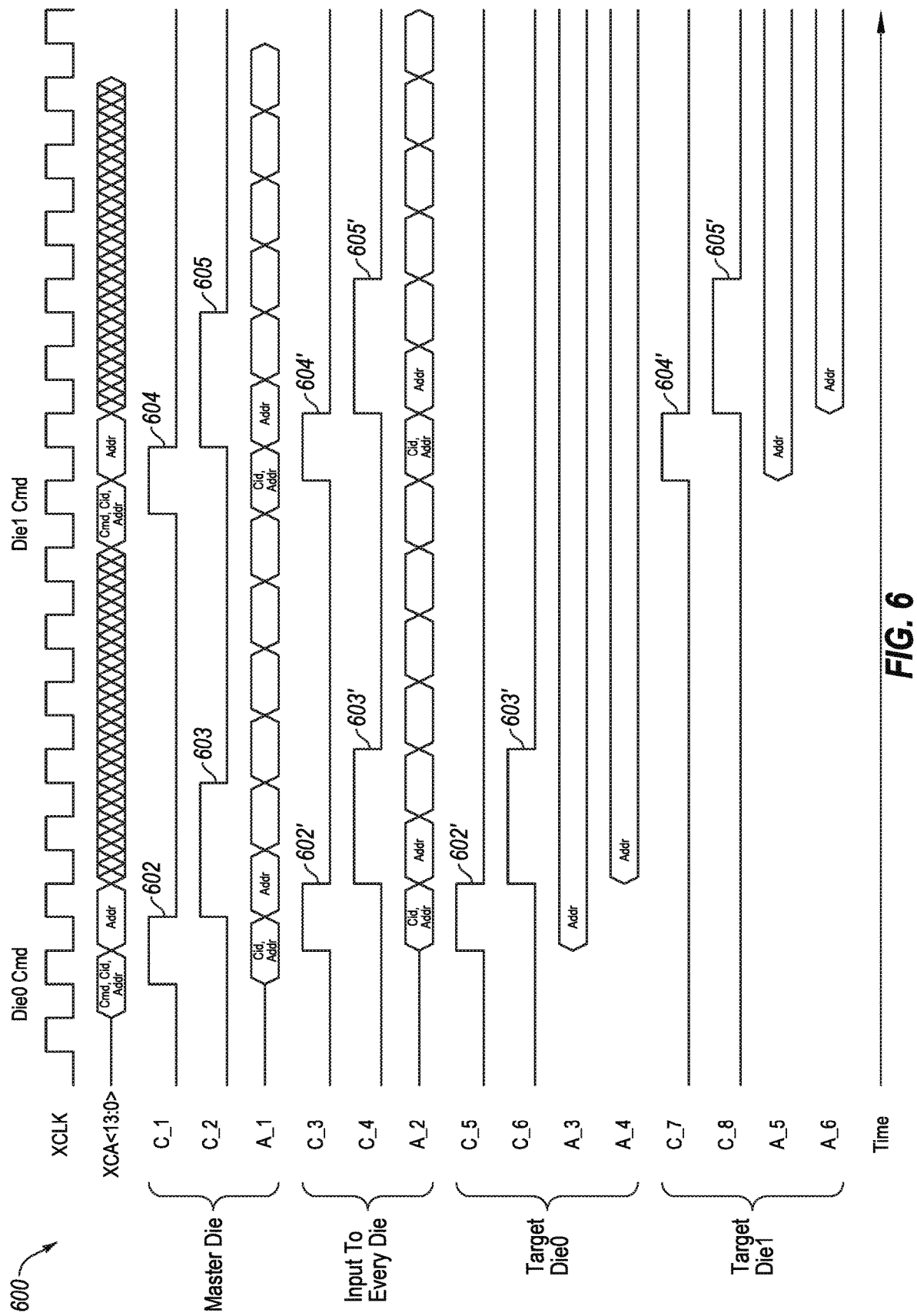
FIG. 6 depicts a timing diagram including various signals associated with a multi-die package configured for use with multi-cycle commands, in accordance with various embodiments of the present disclosure.

FIG. 6 includes a timing diagram 600 including various signals associated with a multi-die package (e.g., multi-dimensional stacking (3DS)) configured for use with multi-cycle commands, in accordance with various embodiments of the present disclosure. For example, timing diagram 600 may be associated with memory device 100 (e.g., a DDR5 device) of FIG. 1. As illustrated in FIG. 6, timing diagram 600 includes external clock signal XCLK and an external command, address, and Cid bit line XCA (i.e., for receiving command bits, address bits, and Cid bits).

Timing diagram 600 further includes a command line C_1 including command signals 602 and 604, a command line C_2 including command signals 603 and 605, and an address latch A_1 (e.g., latch 158_1 of FIG. 1B). In this example, a master die (e.g., master die 110 of FIG. 1 and/or memory die 154_A of FIG. 1B) may include and/or may be coupled to command line C_1, command line C_2, and address latch A_1. Further, timing diagram 600 includes a command line C_3 including command signals 602 and 604, a command line C_4 including command signals 603 and 605, and an address latch A_2 (e.g., latch 168_2 of FIG. 1B). In this example, each die (e.g., master dies 110 each slave die 112 of FIG. 1) may include and/or may be coupled to command line C_3, command line C_4, and address latch A_2. Also, timing diagram 600 includes command lines C_5, C_6, C_7, and C_8, and address latches A_3, A_4, A_5, and A_6. In this example, a die intended to receive command signals 602 and 603 may include and/or may be coupled to command lines C_5 and C_6 and address latches A_3 and A_4 (e.g., latch 168_1 and latch 168_2 of FIG. 1B). Further, a die intended to receive command signals 604 and 605 may include and/or may be coupled to command lines C_7 and C_7, and address latches A_5 and A_6 (e.g., latch 168_1 and latch 168_2 of FIG. 1B).

As shown in timing diagram 600, on a rising edge of external clock signal XCLK, command signal 602 is received and processed (e.g., decoded) at the master die. For example, command signal 602 may include command bits, Cid bits, and possibly some address bits associated with a command. The received Cid and address bits of command signal 602 may be latched on address latch A_1. Further, the master die may convey command signal 602' to each die (i.e., the master dies and each slave die) in the multi-die package.

Further, on a subsequent rising edge of external clock signal XCLK, command signal 603 is received and processed (e.g., decoded) at the master die. For example, command signal 603 may include additional address bits associated with the command. The additional address bits may be latched on address latch A_1, and the master die may convey command signal 603' to each die in the multi-die package.

Moreover, command signal 602' is received at each die via command line C_3, and subsequently, command signal 603' is received at each die via command lined C_4. As expected, command signal 602' on command line C_3 is delayed relative to command signal 602 on command line C_1, and command signal 603' on command line C_4 is delayed relative to command signal 603 on command line C_2.

As noted above, command signal 602 includes command bits, Cid bits, and possibly some address bits associated with a command, and command signal 603 includes at least some additional address bits associated with the command. Further, command signal 602' includes at least some of the command bits, Cid bits, and possibly some address bits associated with the command, and command signal 603' includes at least some additional address bits associated with the command. In some embodiments, command signal 602 and command signal 602' may be in different formats (e.g., encoded v. decoded), and command signal 603 and command signal 603' may be in different formats (e.g., encoded v. decoded).

Upon receipt of command signal 602', each die latches the Cid bits and address bits of command signal 602' on address latch A_2. Further, upon receipt of command signal 603', each die latches the address bits of command signal 603' on address latch A_2. Moreover, each die compares the received Cid bits (i.e., of command signal 602') to its local Cid bits to determine whether the die is an intended recipient of command signal 602'. In this example, the received Cid bits match local Cid bits of target die Die_0, and thus target die Die_0 issues command signal 602' on command line C_5, and latches the associated address bit via address latch A_3. Also, target die Die_0 issues command signal 603' on command line C_6, and latches the associated address bits via address latch A_4.

Continuing with the example shown in timing diagram 600, on a rising edge of external clock signal XCLK, command signal 604 is received and processed (e.g., decoded) at the master die. For example, command signal 604 may include command bits, Cid bits, and possibly some address bits associated with a command. The received Cid and address bits of command signal 604 may be latched on address latch A_1. Further, the master die may convey a command signal 604' to each die (i.e., the master and each slave die) in the multi-die package.

Further, on a subsequent rising edge of external clock signal XCLK, command signal 605 is received and processed (e.g., decoded) at the master die. For example, command signal 605 may include additional address bits associated with the command. The additional address bits may be latched on address latch A_1, and the master die may convey a command signal 605' to each die in the multi-die package.

Moreover, command signal 604' is received at each die via command line C_3, and subsequently, command signal 605' is received at each die via command lined C_4. As expected, command signal 604' on command line C_3 is delayed relative to command signal 604 on command line C_1, and command signal 605' on command line C_4 is delayed relative to command signal 605 on command line C_2.

As noted above, command signal 604 includes command bits, Cid bits, and possibly some address bits associated with a command, and command signal 605 includes at least some additional address bits associated with the command. Further, command signal 604' includes at least some of the command bits, Cid bits, and possibly some address bits associated with the command, and command signal 605' includes at least some additional address bits associated with the command. In some embodiments, command signal 604 and command signal 604' may be in different formats (e.g., encoded v. decoded), and command signal 605 and command signal 605' may be in different formats (e.g., encoded v. decoded).

Upon receipt of command signal 604', each die latches the Cid bits and address bits of command signal 604' on address latch A_2. Further, upon receipt of command signal 605', each die latches the address bits of command signal 605' on address latch A_2. Moreover, each die compares the received Cid bits (i.e., of command signal 604) to its local Cid bits to determine whether the die is an intended recipient of command signal 604'. In this example, the received Cid bits match local Cid bits of target die Die_1, and thus target die Die_1 issues command signal 604' on command line C_7, and latches the associated address bit via address latch A_5. Also, target die Die_1 issues command signal 605' on command line C_8, and latches the associated address bits via address latch A_6.

As described above with reference to timing diagram 600, a first signal (i.e., including command bits, Cid bits and possibly some address bits associated with a command) and a second signal (i.e., including at least some additional address bits associated with the command) may be received on a master die and transmitted to one or more dies (e.g., the master and one or more slave dies). Therefore, in at least these embodiments, the first command may be used to latch the Cid bits at a target die, and the latched Cid bits may be used to enable the command and addresses at the target die. As will be appreciated, these embodiments may reduce a number of signals transmitted to slave dies and/or may improve performance and/or a speed of a device. Further, as will be appreciated, the embodiments disclosed herein may be seamlessly applied in a 2N mode, wherein command signals are received during every other clock cycle (e.g., command signal 602 is received during a first clock cycle and command signal 603 is received during a third clock cycle), as will be appreciated by a person having ordinary skill in the art. For example, in the 2N mode, the Cid bits may still arrive on the first clock, which allows deciding which die is the target die (i.e., in the same way as it is done in the 1N mode).

Figure 7:
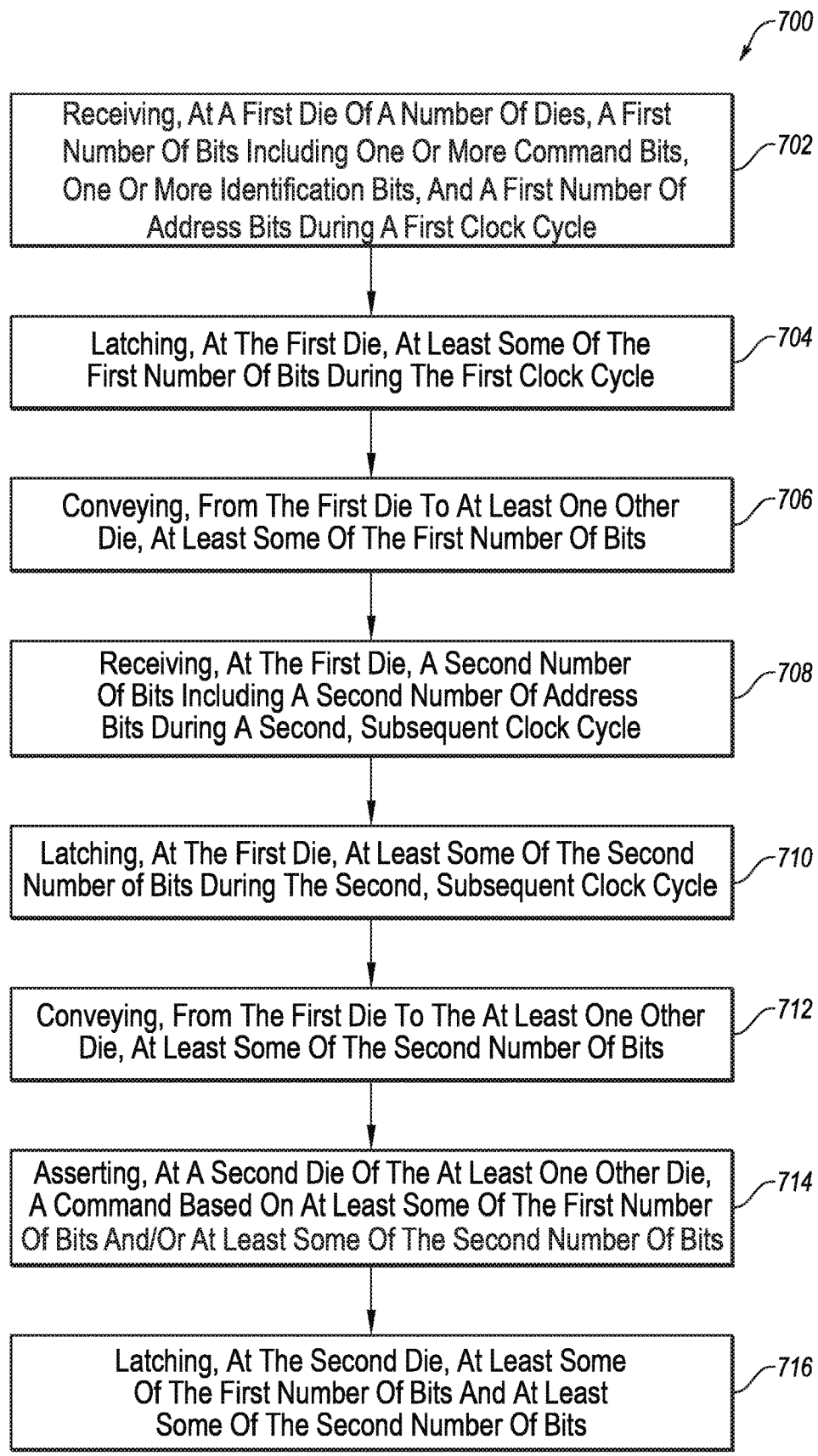
FIG. 7 is a flowchart of an example method of operating a memory device, in accordance with various embodiments of the present disclosure.

FIG. 7 is a flowchart of an example method 700 of operating a memory device, in accordance with various embodiments of the disclosure. Method 700 may be arranged in accordance with at least one embodiment described in the present disclosure. Method 700 may be performed, in some embodiments, by a device or system, such as memory device 100 of FIG. 1A, memory system 150 of FIG. 1B, memory device 200 of FIG. 2, a memory system 800 of FIG. 8, and/or an electronic system 900 of FIG. 9, or another device or system. Although illustrated as discrete blocks, various blocks may be divided into additional blocks, combined into fewer blocks, or eliminated, depending on the desired implementation.

Method 700 may begin at block 702, wherein a first number of bits including one or more command bits, one or more identification bits, and a first number of address bits is received at a first die of a number of dies during a first clock cycle, and method 700 may proceed to block 704. For example, a master die (e.g., master die 110 of FIG. 1) may receive the first number of bits (e.g., via command signal 602 of FIG. 6).

At block 704, at least some of the first number of bits may be latched at the first die, and method 700 may proceed to block 706. For example, at least some of the one or more identification bits (Cid bits) and/or at least some of the first number of address bits may be latched (e.g., via latch 158_1 of FIG. 1B) by the first die (e.g., master die 110 of FIG. 1) during the first clock cycle.

At block 706, at least some of the first number of bits may be conveyed from the first die to at least other die, and method 700 may proceed to block 708. For example, the first die (e.g., master die 110 of FIG. 1) may convey at least some of the first number of bits to at least one other die (e.g., slave dies 112 of FIG. 1).

At block 708, a second number of bits including a second number of address bits is received at the first die during a second, subsequent clock cycle, and method 700 may proceed to block 710. For example, the master die (e.g., master die 110 of FIG. 1) may receive the second number of bits (e.g., via command signal 603 of FIG. 6).

At block 710, at least some of the second number of bits may be latched at the first die, and method 700 may proceed to block 712. For example, the second number of address bits may be latched (e.g., via latch 158_1 of FIG. 1B) by the first die (e.g., master die 110 of FIG. 1) during the second, subsequent clock cycle.

At block 712, at least some of the second number of bits may be conveyed from the first die to the at least other die, and method 700 may proceed to block 714. For example, the first die (e.g., master die 110 of FIG. 1) may convey the at least some of the second number of bits to at least one other die (e.g., slave dies 112 of FIG. 1).

At block 714, a command may be asserted at a second die of the at least one other die based on at least some of the first number of bits and/or at least some of the second number of bits, and method 700 may proceed to block 716. For example, command signal 602 (i.e., on command line C_5) may be asserted by target die Die0 (see FIG. 6).

At block 716, at least some of the first number of bits and at least some of the second number of bits may be latched at the second die. For example, at least some of the first number of bits may be latched by address latch A_3 (e.g., latch 168_1 of FIG. 1B) of target die Die0 (see FIG. 6), and at least some of the second number of bits may be latched by address latch A_4 (e.g., latch 168_2 of FIG. 1B) of target die Die0 (see FIG. 6).

Modifications, additions, or omissions may be made to method 700 without departing from the scope of the present disclosure. For example, the operations of method 700 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, a method may include one or more acts wherein the first number of bits and/or the second number of bits are transmitted from an external device (e.g., external controller and/or external processor) and received at the first die. Further, as another example, a method may include one or more acts wherein, upon receipt of the one or more identification bits, a die compares the one or more identification bits to its local stack identification bits (e.g., to determine if the die is the intended recipient of a command).

A memory system is also disclosed. According to various embodiments, the memory system may include a controller and a memory device including a number of memory dies, such as a master die (e.g., master die 110 of FIG. 1) and at least one slave die (e.g., slave dies 112 of FIG. 1). Each die of the memory device may include one or more memory cell arrays, which may include a number of memory cells.

Figure 8:
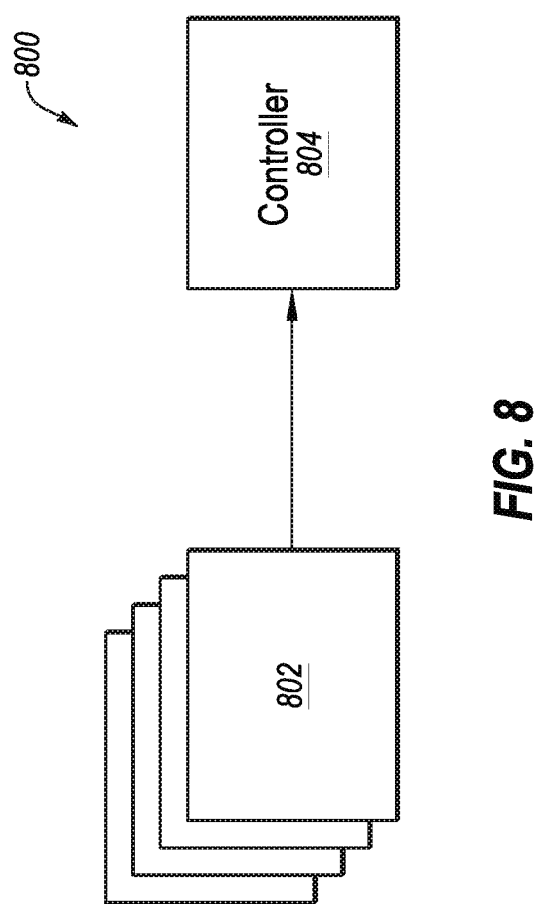
FIG. 8 is a simplified block diagram of a memory system, in accordance with various embodiments of the present disclosure.

FIG. 8 is a simplified block diagram of a memory system 800 implemented according to one or more embodiments described herein. Memory system 800, which may include, for example, a semiconductor device, includes a multi-die package 802 and a controller 804. Multi-die package 802, which may include a number of dies, may include a master die and a number of slave dies. Controller 804 may be operatively coupled with multi-die package 802 so as to convey command/address signals (e.g., command/address signals 226 of FIG. 1) to a master die of multi-die package 802.

An electronic system is also disclosed. According to various embodiments, the electronic system may include a memory device including a number of memory dies, each memory die having an array of memory cells. Each memory cell may include an access transistor and a storage element operably coupled with the access transistor.

Figure 9:
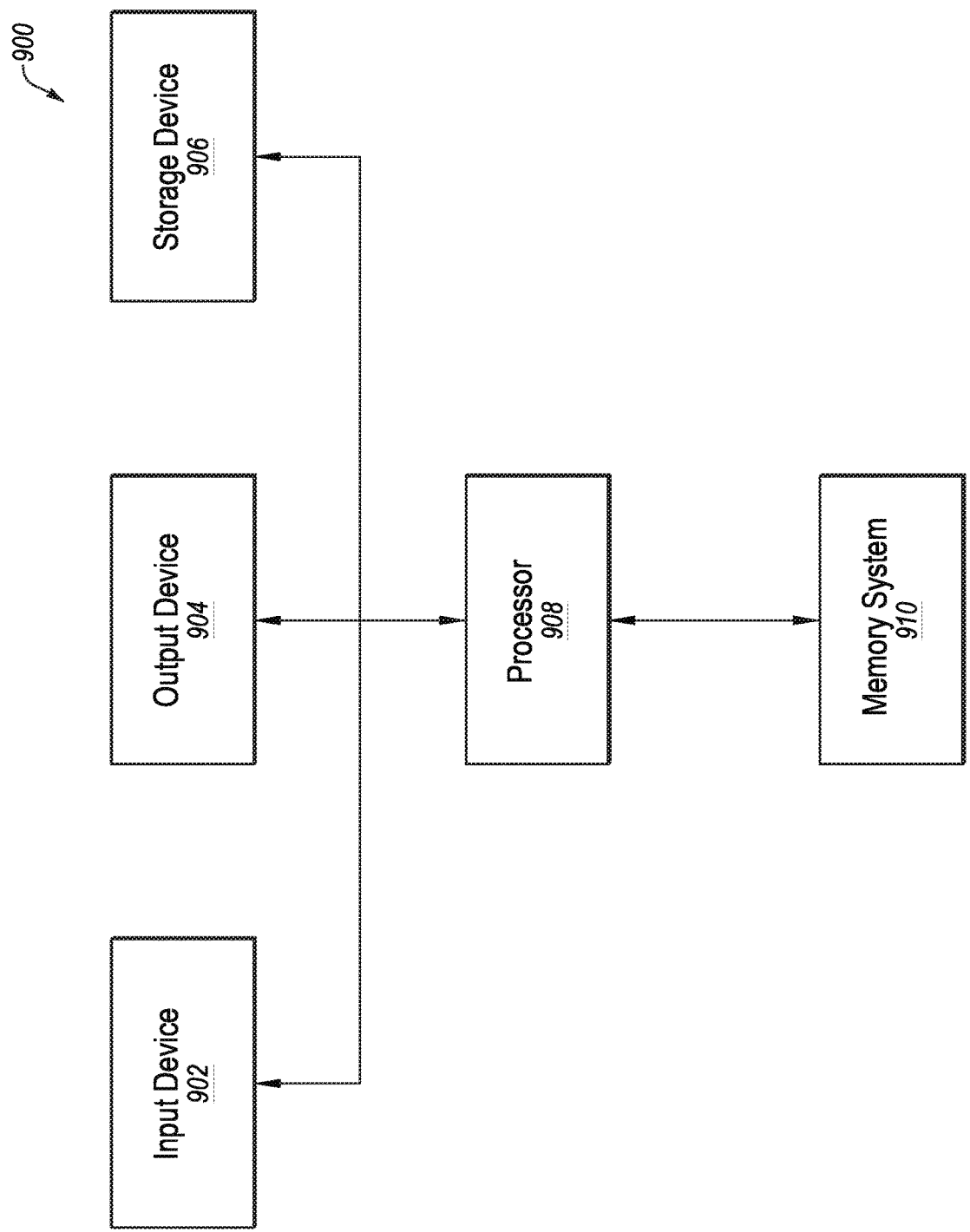
FIG. 9 is a simplified block diagram of an electronic system, in accordance with various embodiments of the present disclosure.

FIG. 9 is a simplified block diagram of an electronic system 900 implemented according to one or more embodiments described herein. Electronic system 900 includes at least one input device 902, which may include, for example, a keyboard, a mouse, or a touch screen. Electronic system 900 further includes at least one output device 904, such as a monitor, a touch screen, or a speaker. Input device 902 and output device 904 are not necessarily separable from one another. Electronic system 900 further includes a storage device 906. Input device 902, output device 904, and storage device 906 may be coupled to a processor 908. Electronic system 900 further includes a memory system 910 coupled to processor 908. Memory system 910, which may include memory system 800 of FIG. 8, may include a memory die package including a master die and a number of slave dies. Electronic system 900 may include, for example, a computing, processing, industrial, or consumer product. For example, without limitation, electronic system 900 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

Various embodiments of the present disclosure may include a memory device. The memory device may include one or more slave dies and a master die. The master die may be configured to receive a first number of bits including one or more command bits and one or more identification bits during a first clock cycle. The master die may also be configured to latch at least some of the identification bits during the first clock cycle. Further, the master die may be configured to convey at least some of the first number of bits to the one or more slave dies. Also, the master die may be configured to receive a second number of bits including a first number of address bits during a second, subsequent clock cycle. Furthermore, the master die may be configured to latch at least some of the second number of bits during the second, subsequent clock cycle. Additionally, the master die may be configured to convey at least some of the second number of bits to the one or more slave dies.

One or more other embodiments of the present disclosure include a method of operating a memory device. The method may include receiving, at a first die of a number of dies, a first number of bits including one or more command bits, one or more identification bits, and a first number of address bits during a first clock cycle. Further, the method may include latching, at the first die, at least some of the first number of bits during the first clock cycle. The method may also include conveying, from the first die to at least one other die, at least some of the first number of bits. Further, the method may include receiving, at the first die, a second number of bits including a second number of address bits during a second, subsequent clock cycle. Also, the method may include latching, at the first die, at least some of the second number of bits during the second, subsequent clock cycle. In addition, the method may include conveying, from the first die to the at least one other die, at least some of the second number of bits.

Additional embodiments of the present disclosure include an electronic system. The electronic system may include at least one input device, at least one output device, and at least one processor device operably coupled to the input device and the output device. The electronic system may also include at least one memory system operably coupled to the at least one processor device and comprising a multi-die package including a master die and at least one slave die. The master die may be configured to receive a first number of bits of a command during a clock cycle, the first number of bits including command bits and chip identification bits associated with the command. The master die may also be configured to receive a second number of bits of the command during a subsequent clock cycle, the second number of bits including address bits associated with the command.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A memory device, comprising:
   one or more slave dies; and
   a master die configured to:
      receive, via a command/address (CA) bus, a first number of bits including one or more command bits, one or more identification bits, and a first number of address bits associated with a command during a first clock cycle;
      convey the first number of bits to the one or more slave dies via a first command signal;
      receive, via the CA bus, a second number of bits including a second number of address bits associated with the command during a second, subsequent clock cycle; and
      convey the second number of bits to the one or more slave dies via a second, different command signal.

2. The memory device of claim 1, wherein the master die is configured to:
   latch at least some of the one or more identification bits during the first clock cycle; and
   latch at least some of the second number of address bits during the second, subsequent clock cycle.

3. The memory device of claim 1, wherein each slave die of the one or more slave dies is configured to:
   receive the first number of bits;
   latch at least some of the one or more identification bits;
   receive the second number of bits; and
   latch at least some of the second number of address bits.

4. The memory device of claim 3, wherein each slave die of the one or more slave dies is further configured to:
   compare the one or more identification bits to one or more stack identification (stack ID) bits associated with the slave die; and
   issue the command in response to the one or more identification bits matching the one or more stack ID bits.

5. The memory device of claim 3, wherein each slave die is configured to:
   latch the at least some of the one or more identification bits via a first address latch; and
   latch the at least some of the second number of address bits via a second address latch.

6. The memory device of claim 1, wherein the first clock cycle and the second, subsequent clock cycle are adjacent clock cycles or the first clock cycle and the second, subsequent clock cycle are separated by at least one other clock cycle.

7. A method of operating a memory device, comprising:
   receiving, via a command/address (CA) bus and at a first die of a number of dies, a first number of bits including one or more command bits, one or more identification bits, and a first number of address bits associated with a command during a first clock cycle;
   latching, at the first die, at least some of: the one or more identification bits; and the first number of address bits during the first clock cycle;
   conveying, from the first die to at least one other die, the first number of bits via a command signal;
   receiving, via the CA bus and at the first die, a second number of bits including a second number of address bits associated with the command during a second, subsequent clock cycle;
   latching, at the first die, at least some of the second number of address bits during the second, subsequent clock cycle; and
   conveying, from the first die to the at least one other die, the second number of bits via another command signal.

8. The method of claim 7, further comprising:
   receiving, at each die of the at least one other die, the first number of bits;
   latching, at each die of the at least one other die, at least some of: the one or more identification bits; and the first number of address bits;
   receiving, at each die of the at least one other die, the second number of bits; and
   latching, at each die of the at least one other die, at least some of the second number of address bits.

9. The method of claim 8, further comprising
   comparing, at each die of the at least one other die, the one or more identification bits to one or more local stack identification (stack ID) bits; and issuing, at a die of the at least one other die, the command in response to the one or more identification bits matching the one or more local stack ID bits.

10. The method of claim 7, further comprising:
asserting the command at a second die of the at least one other die;
latching, at the second die, at least some of the first number of bits; and
latching, at the second die, the second number of bits.

11. The method of claim 10, wherein latching the at least some of the first number of bits at the second die comprises latching the at least some of the first number of bits with a first latch of the second die, and latching the second number of bits at the second die comprises latching the second number of bits with a second latch of the second die.

12. The method of claim 7, wherein the latching the at least some of: the one or more identification bits; and the first number of address bits, and the latching the at least some of the second number of address bits comprises latching the at least some of: the one or more identification bits; and the first number of address bits, and the at least some of the second number of address bits on an address latch.

13. The method of claim 7, wherein receiving at the first die comprises receiving at a DDR5 master die of a multi-stack package.

14. The method of claim 7, wherein conveying from the first die to at least one other die comprises conveying from a master die to at least one other slave die of a DDR5 multi-device package.

15. An electronic system comprising:
at least one input device;
at least one output device;
at least one processor device operably coupled to the input device and the output device; and
at least one memory system operably coupled to the at least one processor device and comprising a multi-die package including a master die and at least one slave die, the master die configured to:
receive, via a command/address (CA) bus, a first number of bits during a clock cycle, the first number of bits including command bits, one or more chip identification bits, and a first number of address bits associated with a command;
receive, via the CA bus, a second number of bits during a subsequent clock cycle, the second number of bits including a second number of address bits associated with the command; and
convey a first command signal including the first number of bits and a second command signal including the second number of bits to the at least one slave die.

16. The electronic system of claim 15, wherein each slave die of the at least one slave die is configured to:
receive the first number of bits;
latch at least some of the one or more chip identification bits via an address latch;
receive the second number of bits; and
latch at least some of the second number of address bits via the address latch.

17. The electronic system of claim 15, wherein each slave die of the at least one slave die is configured to:
compare the one or more chip identification bits to one or more local stack identification (stack ID) bits; and
issue the command in response to the one or more chip identification bits matching the one or more local stack ID bits.

18. The electronic system of claim 15, wherein the multi-die package comprises a DDR5 device.

19. The memory device of claim 1, wherein:
the first number of bits are received at the one or more slave dies during a third clock cycle; and
the second number of bits are received at the one or more slave dies during a fourth clock cycle, subsequent to the third clock cycle.

20. The electronic system of claim 15, wherein each slave die of the at least one slave die is configured to is configured to receive the second number of bits via a command signal after receiving the first number of bits via a another, different command signal.

* * * * *

UNITED STATES PATENT AND TRADEMARK OFFICE
CERTIFICATE OF CORRECTION

Page 1 of 1

PATENT NO.         : 11,164,613 B2
APPLICATION NO.    : 16/700212
DATED              : November 2, 2021
INVENTOR(S)        : Vijayakrishna J. Vankayala It is certified that error appears in the above-identified patent and that said Letters Patent is hereby corrected as shown below:

In the Specification
Column 7, Line 44, change "Diel" to --Die1--
Column 7, Line 45, change "Diel" to --Die1--

Signed and Sealed this
Twenty-eighth Day of December, 2021

Drew Hirshfeld
*Performing the Functions and Duties of the*
*Under Secretary of Commerce for Intellectual Property and*
*Director of the United States Patent and Trademark Office*